US007834444B2

(12) United States Patent
Awad et al.

(10) Patent No.: US 7,834,444 B2
(45) Date of Patent: Nov. 16, 2010

(54) HEATPLATES FOR HEATSINK ATTACHMENT FOR SEMICONDUCTOR CHIPS

(75) Inventors: Elie Awad, Essex Junction, VT (US); John Jay Maloney, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 74 days.

(21) Appl. No.: 12/393,346

(22) Filed: Feb. 26, 2009

(65) Prior Publication Data

US 2009/0200660 A1 Aug. 13, 2009

Related U.S. Application Data

(63) Continuation of application No. 11/602,861, filed on Nov. 21, 2006, now Pat. No. 7,498,673.

(51) Int. Cl.
*H01L 23/34* (2006.01)

(52) U.S. Cl. ....................... 257/706; 257/675; 257/704; 257/718; 257/719; 257/722; 257/726; 257/727; 257/E23.051; 257/E23.086; 257/E23.101; 257/E23.102; 361/687; 361/709; 361/712; 174/545; 174/548; 174/561; 174/562; 437/122

(58) Field of Classification Search ....................... None
See application file for complete search history.

(56) References Cited

U.S. PATENT DOCUMENTS

| | | | |
|---|---|---|---|
| 5,548,482 | A | 8/1996 | Hatauchi et al. |
| 5,898,219 | A | 4/1999 | Barrow |
| 5,926,369 | A | 7/1999 | Ingraham et al. |
| 5,969,947 | A | 10/1999 | Johnson et al. |
| 6,105,215 | A | 8/2000 | Lee |
| 6,219,238 | B1 | 4/2001 | Andros et al. |
| 6,373,703 | B2 | 4/2002 | Johnson et al. |
| 6,473,305 | B1 | 10/2002 | Gordon et al. |
| 6,496,374 | B1 | 12/2002 | Caldwell |
| 6,512,675 | B1 | 1/2003 | Tarter et al. |
| 6,562,655 | B1 | 5/2003 | Glenn et al. |
| 6,580,167 | B1 | 6/2003 | Glenn et al. |
| 6,643,137 | B1 | 11/2003 | Chung et al. |
| 6,744,132 | B2 | 6/2004 | Alcoe et al. |

(Continued)

OTHER PUBLICATIONS

Notice of Allowance (Mail Date Oct. 17, 2008) for U.S. Appl. No. 11/602,861, filed Nov. 21, 2006; Confirmation No. 8871.

*Primary Examiner*—Jasmine J Clark
(74) *Attorney, Agent, or Firm*—Schmeiser, Olsen & Watts; Wenjie Li

(57) ABSTRACT

An apparatus for heatsink attachment and a method for forming the apparatus. The apparatus includes a substrate, a semiconductor chip on top of and physically attached to the substrate, and a lid on top of the substrate. The lid includes a first thermally conductive material. The apparatus further includes a heatsink on top of the lid. The heatsink includes a second thermally conductive material. The semiconductor chip and the substrate share a common interface surface that defines a reference direction perpendicular to the common interface surface and pointing from the substrate towards the semiconductor chip. The lid is disposed between the substrate and the heatsink. The lid includes a first protruding member. The first protruding member of the lid is farther away from the substrate than a portion of the heatsink in the reference direction.

20 Claims, 11 Drawing Sheets

U.S. PATENT DOCUMENTS 6,775,140 B2 * 8/2004 Shim et al. .................. 361/704
6,809,929 B2 10/2004 Liu
6,826,052 B2 11/2004 Ma
6,865,083 B2 3/2005 Liu
6,919,630 B2 7/2005 Hsiao
7,355,858 B2 4/2008 Gruendler et al.
7,411,790 B2 8/2008 Huang

* cited by examiner 180
182a'
182a
182b
182b'

FIG.1Bii

FIG.1Biii

FIG.1Biv

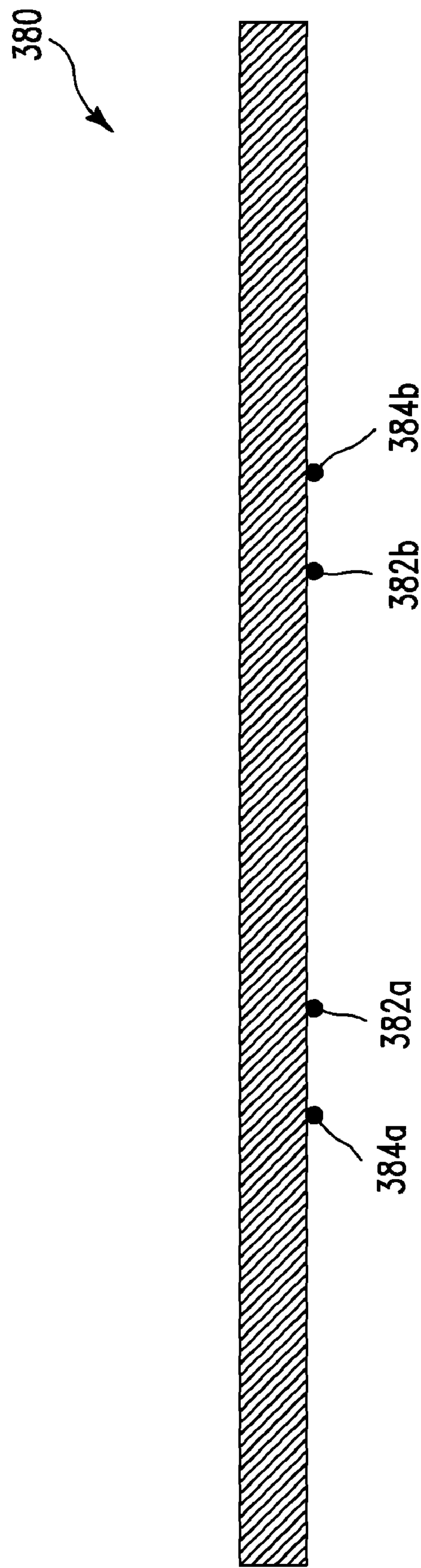
FIG.3Bi
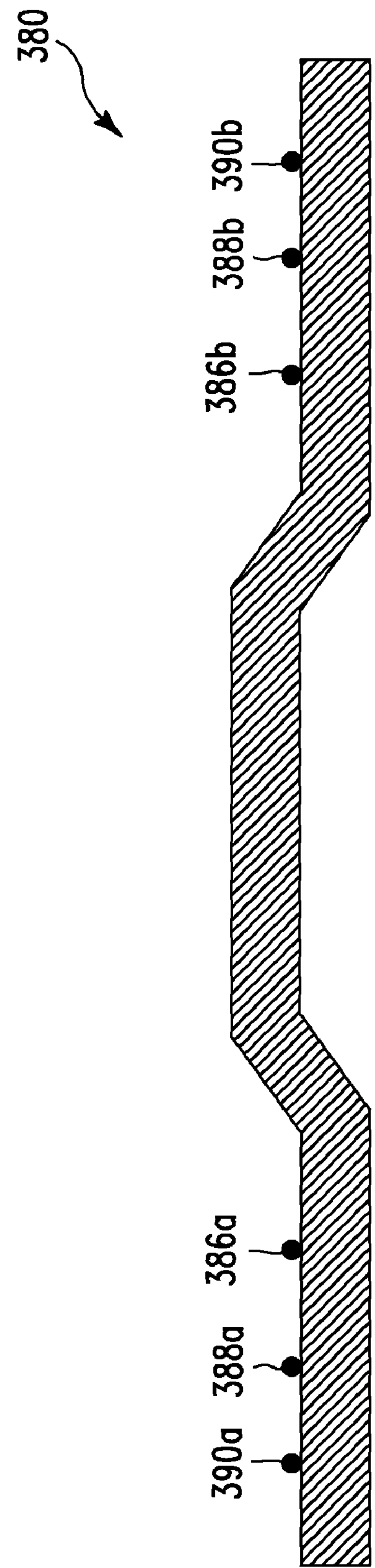
FIG.3Bii

HEATPLATES FOR HEATSINK ATTACHMENT FOR SEMICONDUCTOR CHIPS

This application is a continuation application claiming priority to Ser. No. 11/602,861, filed Nov. 21, 2006.

FIELD OF THE INVENTION

The present invention relates generally to semiconductor chips and more particularly to heatplates for heatsink attachment for semiconductor chips.

BACKGROUND OF THE INVENTION

In the prior art, after a semiconductor chip is attached to a printed circuit board, a heatsink is conventionally placed on top of the chip via a heatplate so as to absorb the heat generated from the chip during the chip operation. To hold the heatsink in place, clips are conventionally used to hold the heatsink to the printed circuit board. In other words, areas of the printed circuit board must be used for the clips to hold the heatsink in place. Therefore, there is a need for an apparatus (and a method for forming the same) in which the heatsink is held in place without utilizing areas of the printed circuit board.

SUMMARY OF THE INVENTION

The present invention provides a structure, comprising (a) a substrate; (b) a semiconductor chip on top of and physically attached to the substrate; (c) a lid on top of the substrate, wherein the lid comprises a first thermally conductive material; and (d) a heatsink on top of the lid, wherein the heatsink comprises a second thermally conductive material, wherein the semiconductor chip and the substrate share a common interface surface that defines a reference direction perpendicular to the common interface surface and pointing from the substrate towards the semiconductor chip, wherein the lid is disposed between the substrate and the heatsink, wherein the lid comprises a first protruding member, and wherein the first protruding member of the lid is farther away from the substrate than a portion of the heatsink in the reference direction.

The present invention also provides a structure formation method, comprising providing a structure which includes (a) a substrate; (b) a semiconductor chip on top of and physically attached to the substrate, wherein the semiconductor chip and the substrate share a common interface surface that defines a reference direction perpendicular to the common interface surface and pointing from the substrate towards the semiconductor chip; and (c) a lid on top of the substrate, wherein the lid comprises a first thermally conductive material; and placing a heatsink on top of the substrate, wherein the heatsink comprises a second thermally conductive material, wherein the lid is disposed between the substrate and the heatsink, wherein the lid comprises a first protruding member, and wherein the first protruding member of the lid is farther away from the substrate than a portion of the heatsink in the reference direction.

The present invention provides an apparatus (and a method for operating the same) in which the heatsink is held in place without utilizing areas of the printed circuit board.

BRIEF DESCRIPTION OF THE DRAWINGS

FIG. 1Ai shows a perspective view of the structure of FIG. 1A along a line 1Ai-1Ai of FIG. 1A.

FIGS. 3B-4 illustrates a process for forming a lid of FIG. 3A, in accordance with embodiments of the present invention.

DETAILED DESCRIPTION OF THE INVENTION

Figure 1A:
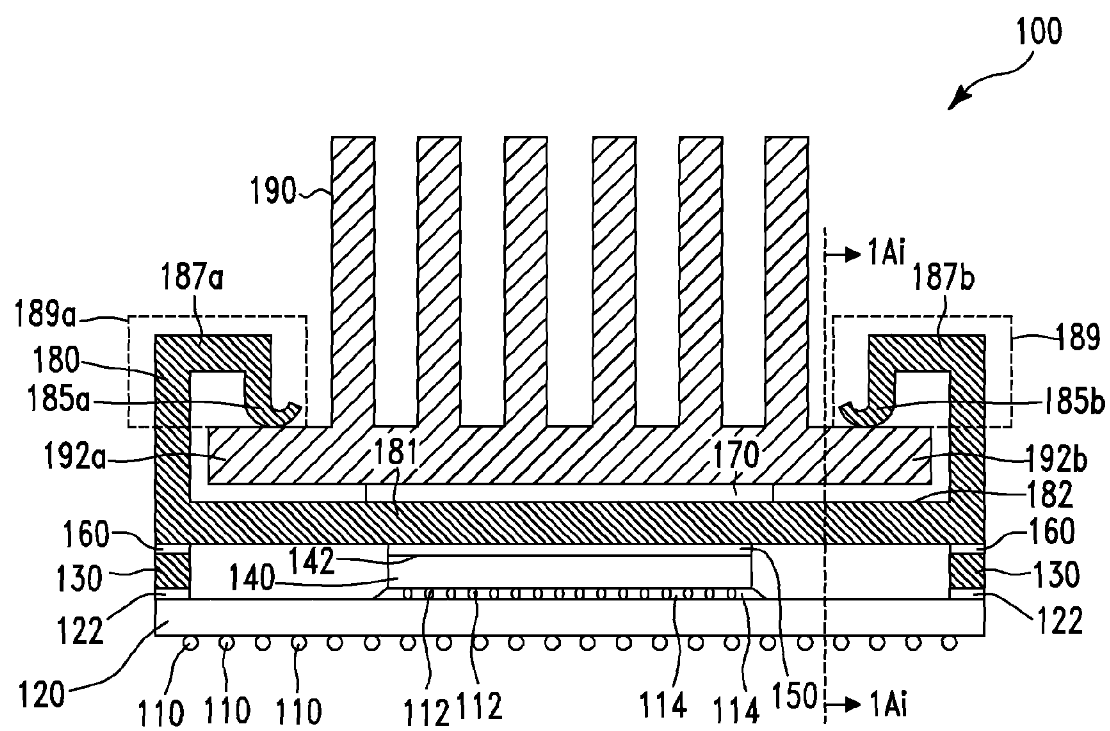
FIG. 1A shows a cross-section view of a structure, in accordance with embodiments of the present invention.
Figure 1A:
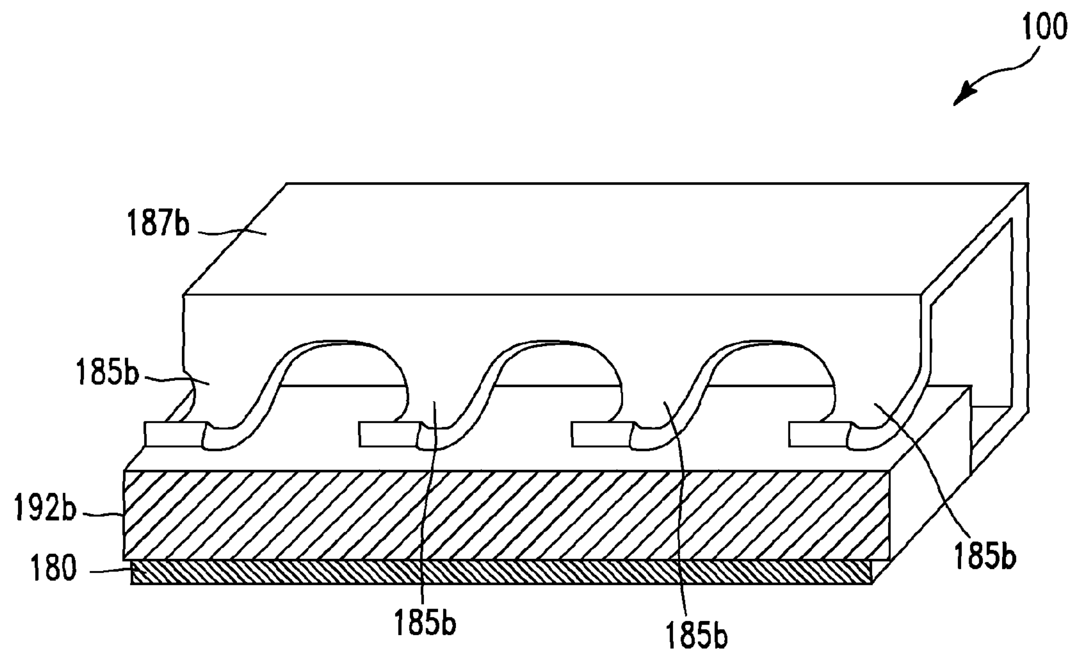

FIG. 1A shows a cross-section view of a structure 100, in accordance with embodiments of the present invention. More specifically, in one embodiment, the structure 100 comprises an organic substrate 120 and a chip 140 which is attached to the organic substrate 120. Illustratively, the chip 140 comprises solder balls 112 which electrically connect devices (not shown) of the chip 140 to substrate pads (not shown) of the organic substrate 120. In one embodiment, the organic substrate 120 comprises substrate balls 110 which are electrically connected to the solder balls 112. Illustratively, the structure 100 further comprises an underfill layer 114 which physically holds the chip 140 tightly to the organic substrate 120.

In one embodiment, the structure 100 further comprises a stiffener 130, a lid (also called heatplate) 180, and a heatsink 190. Illustratively, the stiffener 130 and the lid 180 comprise nickel plated copper. In one embodiment, the heatsink 190 comprises aluminum. Illustratively, the stiffener 130 is attached to the organic substrate 120 by an adhesive layer 122. In one embodiment, the lid 180 is attached to the bottom surface 142 of the chip 140 by a thermal adhesive layer 150. Illustratively, the thermal adhesive layer 150 comprises a thermally conductive material. In one embodiment, the lid 180 is also attached to the stiffener 130 by an adhesive layer 160. Illustratively, the heatsink 190 is pressed down by holders 185*a* and 185*b* of the lid 180 against a top surface 182 of the lid 180 via a thermal grease layer 170. In one embodiment, the thermal grease layer 170 comprises a thermally conductive material. Illustratively, the structure 100 of FIG. 1A can be electrically coupled to a circuit board (not shown) using the substrate balls 110.

In one embodiment, with reference to FIG. 1A, the structure 100 can be formed as follows. Illustratively, after being fabricated, the chip 140 is flipped up side down and then is attached to the organic substrate 120 using the solder balls 112 of the chip 140 and the underfill layer 114. Next, in one embodiment, the stiffener 130 is physically attached to the organic substrate 120 using the adhesive layer 122. Next, in one embodiment, the lid 180 is (i) physically attached to the stiffener 130 using the adhesive layer 160 and (ii) thermally and physically coupled to the bottom 142 of the chip 140 via the thermal adhesive layer 150. Then, in one embodiment, the thermal grease layer 170 is applied to the top surface 182 of the lid 180. Next, in one embodiment, the heatsink 190 is slid into place in a direction perpendicular to the page. In one embodiment, the heatsink 190 is held in place by the holders 185*a* and 185*b* that press the heatsink 190 down against the top surface 182 of the lid 180.

FIG. 1Ai shows a perspective view of the structure 100 along a line 1Ai-1Ai of FIG. 1A.

Figure 1B:
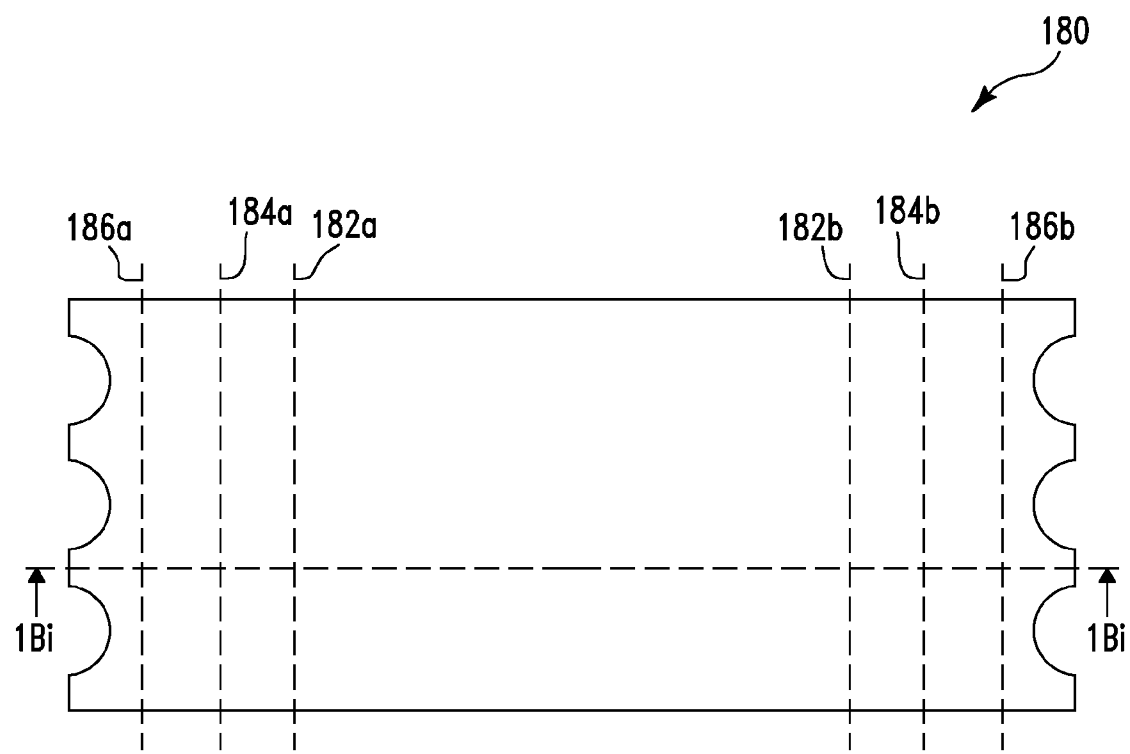
FIGS. 1B-1Biv illustrate a process for forming a lid of FIG. 1A, in accordance with embodiments of the present invention.
Figure 1:
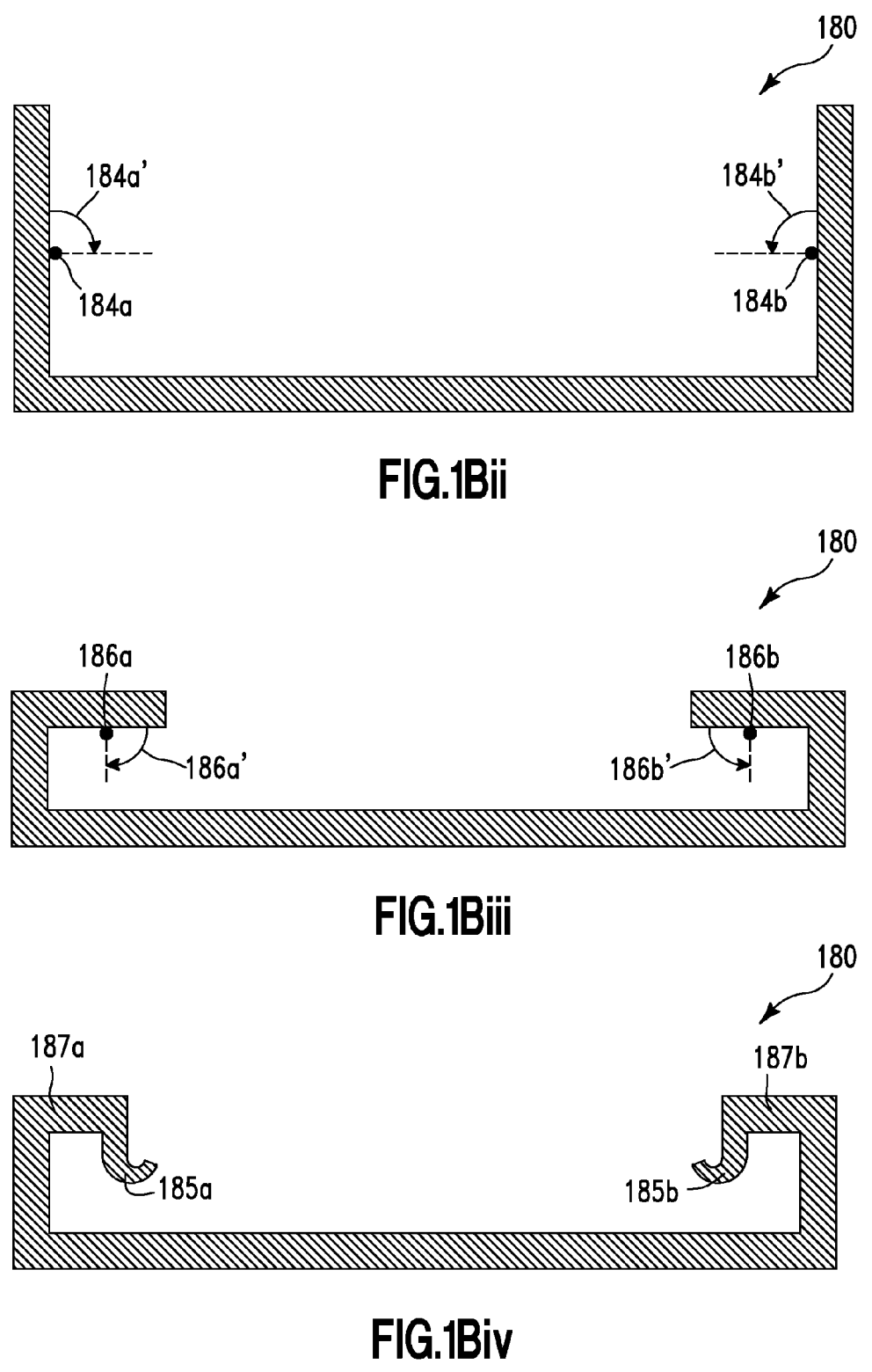

FIGS. 1B-1Biv illustrate a process for forming the lid 180 of FIG. 1A, in accordance with embodiments of the present invention. More specifically, in one embodiment, the process for forming the lid 180 starts with the lid 180 of FIG. 1B (top-down view). FIG. 1Bi shows a cross-section view of the lid 180 of FIG. 1B along a line 1Bi-1Bi.

Next, in one embodiment, with reference to FIGS. 1B and 1Bi, the lid 180 is bent in directions 182*a*' and 182*b*' along lines 182*a* and 182*b*, respectively, resulting in the lid 180 of FIG. 1Bii. Next, in one embodiment, the lid 180 of FIG. 1Bii is bent in directions 184*a*' and 184*b*' along lines 184*a* and 184*b*, respectively, resulting in the lid 180 of FIG. 1Biii. Then, in one embodiment, the lid 180 of FIG. 3Biii is bent in directions 186*a*' and 186*b*' along lines 186*a* and 186*b*, respectively, resulting in the lid 180 of FIG. 1Biv.

Figure 1C:
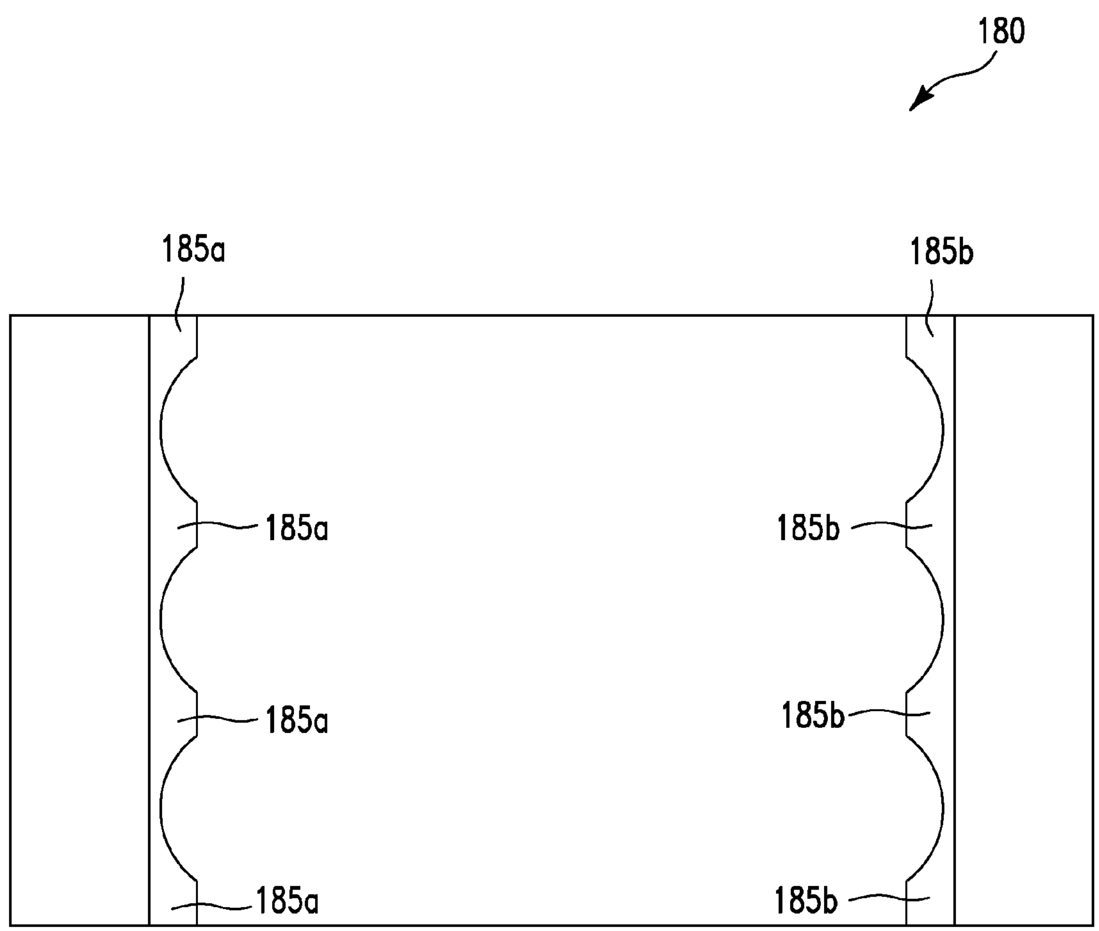
FIG. 1C shows a top-down view of the lid of FIG. 1Biv.

FIG. 1C shows a top-down view of the lid 180 of FIG. 1Biv.

Figure 2A:
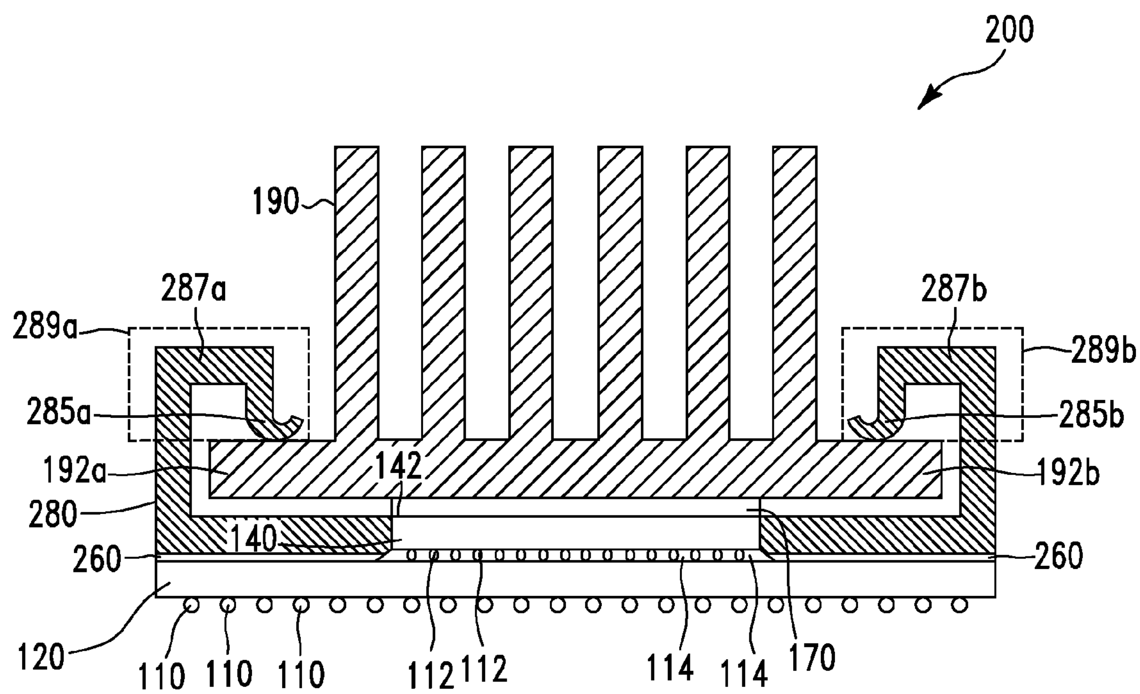
FIG. 2A shows a cross-section view of a structure, in accordance with embodiments of the present invention.

FIG. 2A shows a cross-section view of a structure 200, in accordance with embodiments of the present invention. More specifically, in one embodiment, the structure 200 is similar to the structure 100 of FIG. 1A except that the structure 200 does not have the stiffener 130 and that a lid 280 of the structure 200 is different from the lid 180 of the structure 100 (FIG. 1A). More specifically, in one embodiment, the lid 280 is similar to the lid 180 of FIG. 1A except that the lid 280 has an opening 282 (not shown in FIG. 2A but shown in FIG. 2B) that allows for closer thermal contact of the heatsink 190 to the bottom surface 142 of the chip 140 via the thermal grease layer 170 (FIG. 2A). Illustratively, the lid 280 is attached to the organic substrate 120 by an adhesive layer 260, whereas the heatsink 190 is pressed down against the bottom surface 142 of the chip 140 by the holders 185*a* and 185*b* of the lid 280 via the thermal grease layer 170.

Figure 2B:
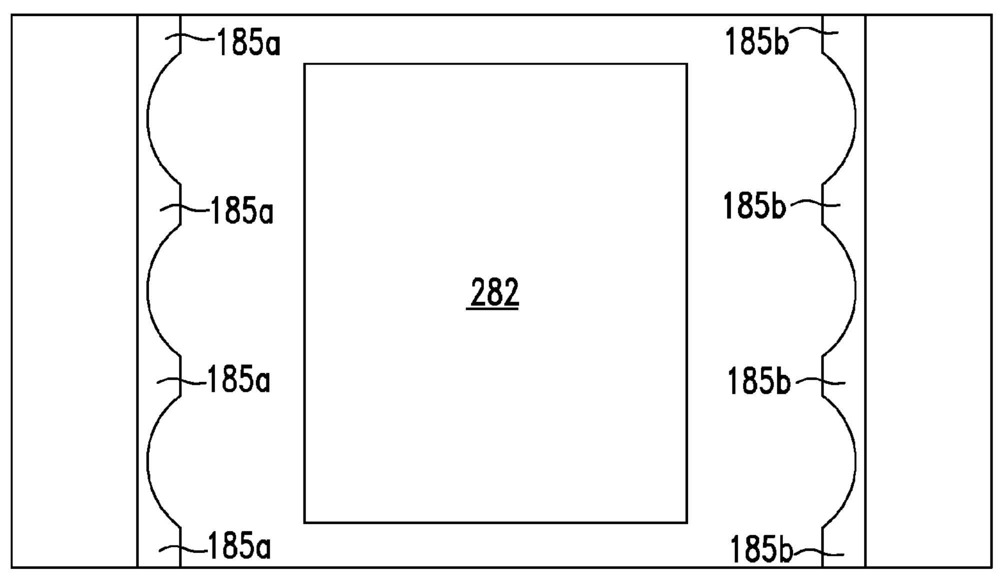
FIG. 2B shows a top-down view of a lid of FIG. 2A.

In one embodiment, with reference to FIG. 2A, the structure 200 can be formed as follows. Illustratively, after being fabricated, the chip 140 is flipped up side down and then is attached to the organic substrate 120 using the solder balls 112 of the chip 140 and the underfill layer 114. Next, in one embodiment, the lid 280 is physically attached to the organic substrate 120 using the adhesive layer 260 such that the chip 140 fits in the opening 282 (FIG. 2B). Then, in one embodiment, the thermal grease layer 170 is applied to the bottom surface 142 of the chip 140. Next, in one embodiment, the heatsink 190 is slid into place in a direction perpendicular to the page. In one embodiment, the heatsink 190 is held in place by the holders 185*a* and 185*b* that press the heatsink 190 down against the bottom surface 142 of the chip 140 via the thermal grease layer 170.

FIG. 2B shows a top-down view of the lid 280 of FIG. 2A. As can be seen in FIG. 2B, the lid 280 is similar to the lid 180 of FIG. 1C except that the lid 280 has an opening 282. In one embodiment, the formation of the lid 280 is similar to the formation of the lid 180 of FIG. 1Biv.

Figure 3A:
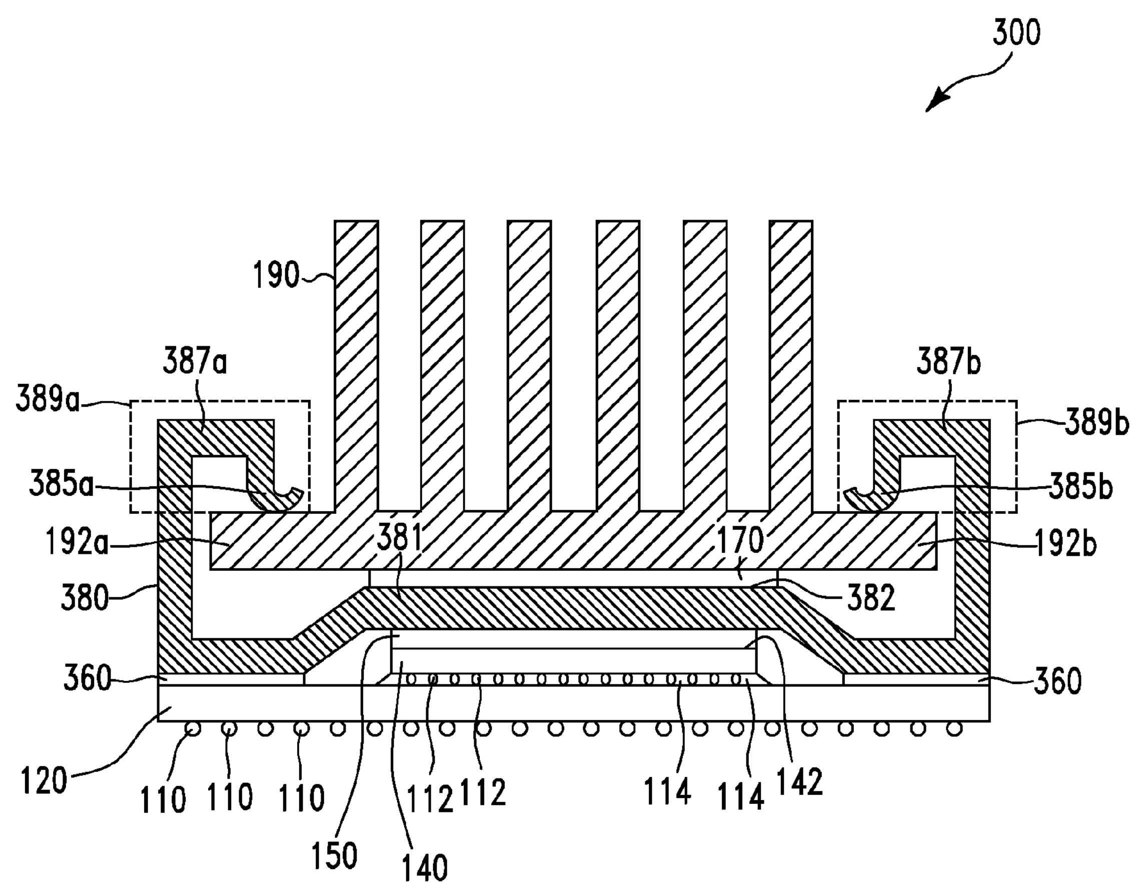
FIG. 3A shows a cross-section view of a structure, in accordance with embodiments of the present invention.

FIG. 3A shows a cross-section view of a structure 300, in accordance with embodiments of the present invention. More specifically, in one embodiment, the structure 300 is similar to the structure 100 of FIG. 1A except that the structure 300 does not have the stiffener 130 and that a lid 380 of the structure 300 is different from the lid 180 of the structure 100. More specifically, the lid 380 is similar to the lid 180 of FIG. 1A except that a bottom member 381 of the lid 380 concaves up to create space for the chip 140. In one embodiment, the lid 380 is attached to the organic substrate 120 by an adhesive layer 360.

In one embodiment, with reference to FIG. 3A, the structure 300 can be formed as follows. Illustratively, after being fabricated, the chip 140 is flipped up side down and then is attached to the organic substrate 120 using the solder balls 112 of the chip 140 and the underfill layer 114. Next, in one embodiment, the lid 380 is (i) physically attached to the organic substrate 120 using the adhesive layer 360 and (ii) thermally and physically coupled to the bottom 142 of the chip 140 via the thermal adhesive layer 150. Then, in one embodiment, the thermal grease layer 170 is applied to the top surface 382 of the lid 380. Next, in one embodiment, the heatsink 190 is slid into place in a direction perpendicular to the page. In one embodiment, the heatsink 190 is held in place by the holders 185*a* and 185*b* that press the heatsink 190 down against the top surface 382 of the lid 380 via the thermal grease 170.

Figure 3B:
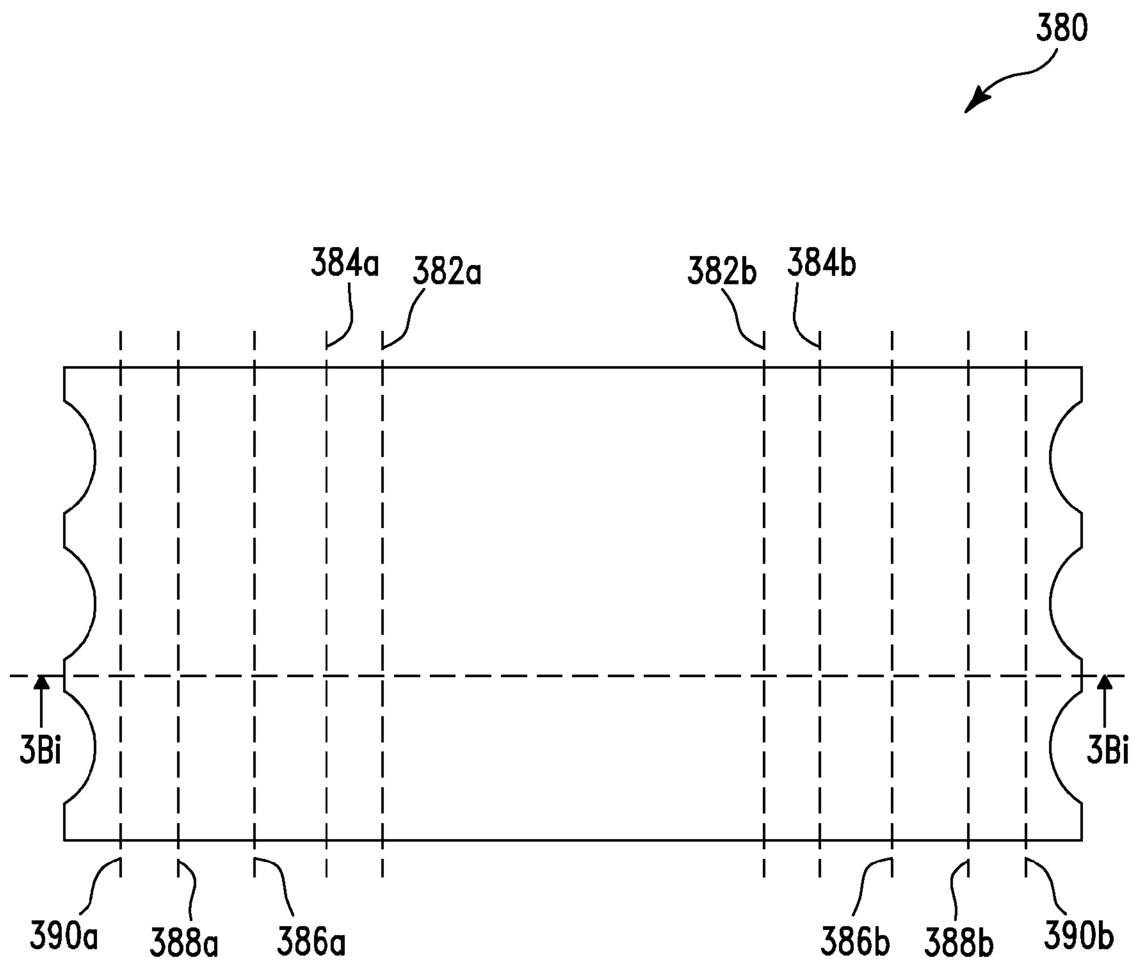
Figure 4:
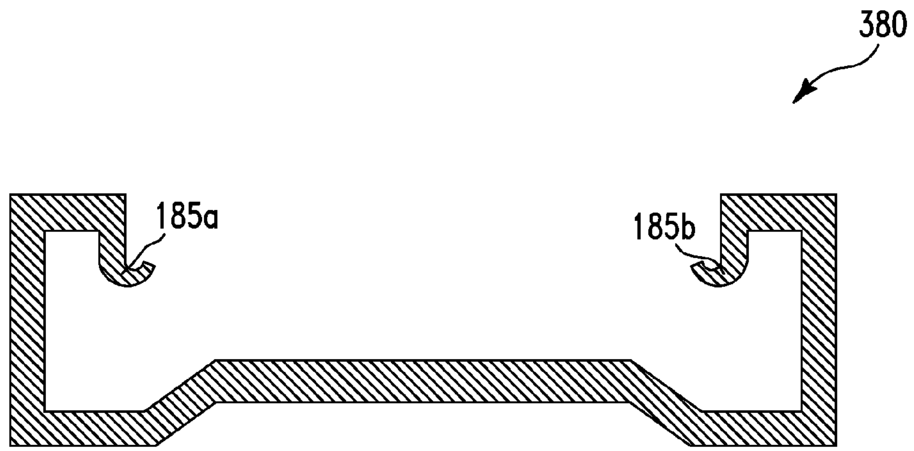

FIGS. 3B-4 illustrates a process for forming the lid 380 of FIG. 3A, in accordance with embodiments of the present invention. More specifically, in one embodiment, the process for forming the lid 380 starts with the lid 380 of FIG. 3B (top-down view). FIG. 3Bi shows a cross-section view of the lid 380 of FIG. 3B along a line 3Bi-3Bi.

Next, in one embodiment, with reference to FIG. 3Bi, the lid 380 is bent along lines 382*a* and 382*b* and then is bent along lines 384*a* and 384*b* resulting in the lid 380 of FIG. 3Bii. Next, in one embodiment, with reference to FIG. 3Bii, the lid 380 (i) is bent along lines 386*a* and 386*b*, then (ii) is bent along lines 388*a* and 388*b*, and then (iii) is bent along lines 390*a* and 390*b* resulting in the lid 380 of FIG. 4.

In summary, with reference to FIGS. 1A, 2A, and 3A, the holders 185*a* and 185*b* help hold the heatsink 190 in place by pressing the heatsink 190 down against the top surface 182 of the lid 180 (FIG. 1A), or the bottom surface 142 of the chip 140 (FIG. 2A), or the top surface 382 of the lid 380 (FIG. 3A).

Figure 5A:
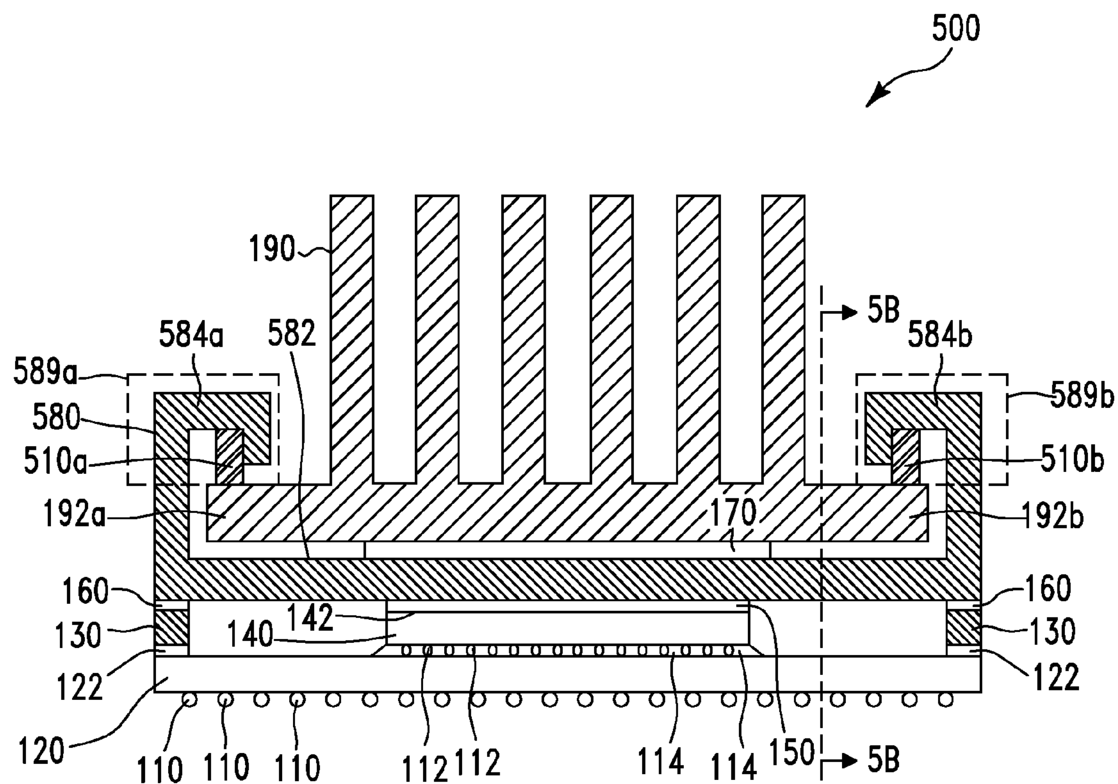
FIG. 5A shows a cross-section view of a structure, in accordance with embodiments of the present invention.

FIG. 5A shows a cross-section view of a structure 500, in accordance with embodiments of the present invention. More specifically, in one embodiment, the structure 500 is similar to the structure 100 of FIG. 1A except that the structure 500 comprises springs 510*a* and 510*b* and that a lid 580 of the structure 500 is different from the lid 180 of FIG. 1A. Illustratively, the springs 510*a* and 510*b* are elastic structures. An elastic structure is a structure that tends to change its shape when being applied a force and tends to change back to its original shape when the force is removed. In one embodiment, the springs 510*a* and 510*b* can have any size and shape provided that the springs 510*a* and 510*b* maintain pressure against overhangs 584*a* and 584*b* of the lid 580 and horizontal members 192*a* and 192*b* of the heatsink 190, respectively. Illustratively, the lid 580 is similar to the lid 180 (FIG. 1A) except that the lid 50 does not have holders (like the holders 185*a* and 185*b* of FIG. 1A). Instead, the overhangs 584*a* and 584*b* keep the springs 510*a* and 510*b* pressing the horizontal members 192*a* and 192*b* down, respectively, resulting in the heatsink 190 being pressed down against the top surface 582 of the lid 580 via the thermal grease layer 170.

In one embodiment, with reference to FIG. 5A, the structure 500 can be formed as follows. Illustratively, after being fabricated, the chip 140 is flipped up side down and then is attached to the organic substrate 120 using the solder balls 112 of the chip 140 and the underfill layer 114. Next, in one embodiment, the stiffener 130 is physically attached to the organic substrate 120 using the adhesive layer 122. Next, in one embodiment, the lid 580 is (i) physically attached to the stiffener 130 using the adhesive layer 160 and (ii) thermally and physically coupled to the bottom 142 of the chip 140 via the thermal adhesive layer 150. Then, in one embodiment, the thermal grease layer 170 is applied to the top surface 582 of the lid 580. Next, in one embodiment, the heatsink 190 is slid into place in a direction perpendicular to the page.

Next, in one embodiment, the spring 510*a* is slid into place between the overhang 584*a* and the horizontal member 192*a* of the heatsink 190. Similarly, the spring 510*b* is slid into place between the overhang 584*b* and the horizontal member 192*b* of the heatsink 190. As a result, the heatsink 190 is held in place by the springs 510*a* and 510*b* that press the heatsink 190 down against the top surface 582 of the lid 580 via the thermal grease layer 170.

Figure 5B:
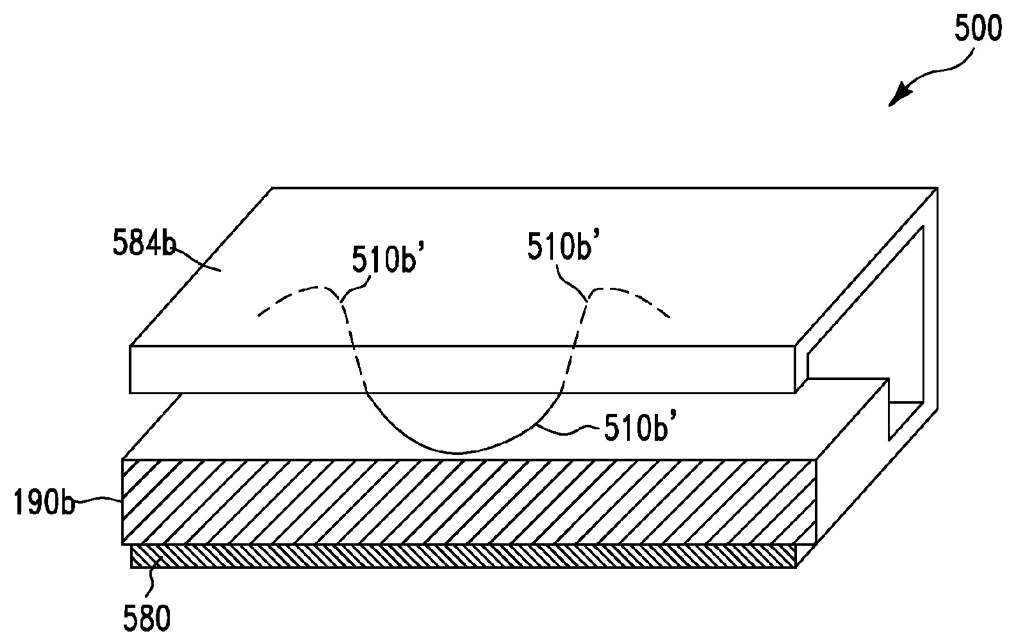
FIG. 5B shows a perspective view of the structure of FIG. 5A along a line 5B-5B of FIG. 5A.

FIG. 5B shows a perspective view of the structure 500 along a line 5B-5B of FIG. 5A. It should be noted that a spring 510*b*' of FIG. 5B is an alternative embodiment of the spring 510*b* of FIG. 5A.

Figure 6:
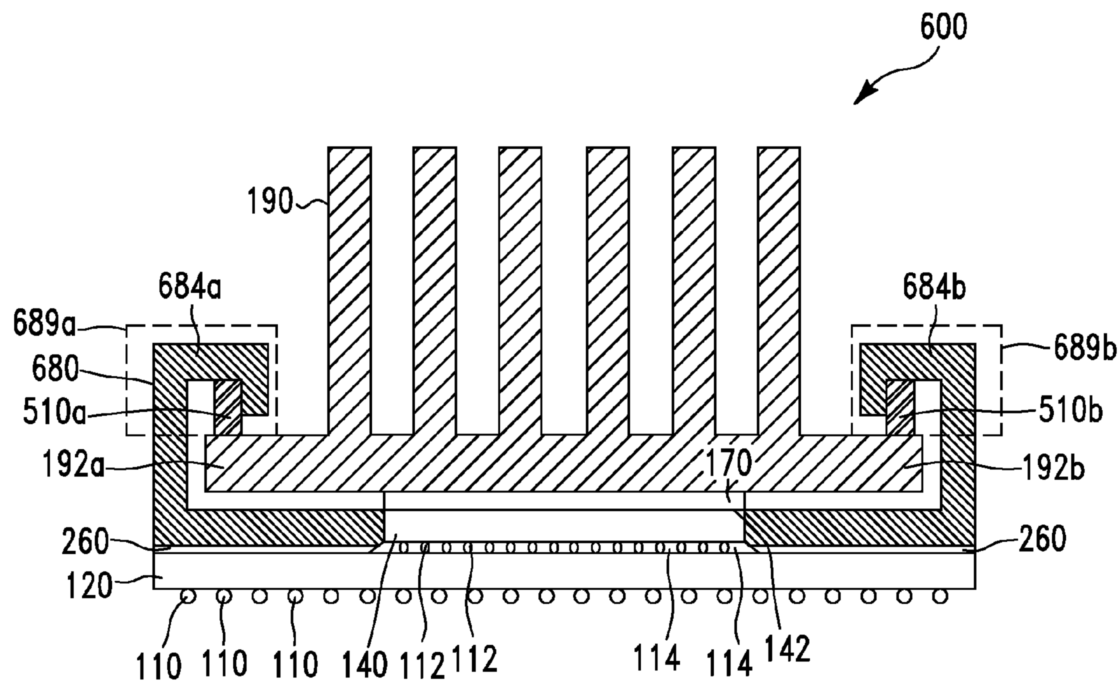
FIG. 6 shows a cross-section view of a structure, in accordance with embodiments of the present invention.

FIG. 6 shows a cross-section view of a structure 600, in accordance with embodiments of the present invention. More specifically, in one embodiment, the structure 600 is similar to the structure 200 of FIG. 2A except that the structure 600 comprises the springs 510*a* and 510*b* and that a lid 680 of the structure 600 is different from the lid 280 of FIG. 2A. Illustratively, the lid 680 is similar to the lid 280 (FIG. 2A) except that the lid 680 does not have holders (like the holders 185*a* and 185*b* of FIG. 2A). Instead, overhangs 684*a* and 684*b* keep the springs 510*a* and 510*b* pressing the horizontal members 192*a* and 192*b* down, respectively, resulting in the heatsink 190 being pressed down against the bottom surface 142 of the chip 140 via the thermal grease layer 170.

Figure 7:
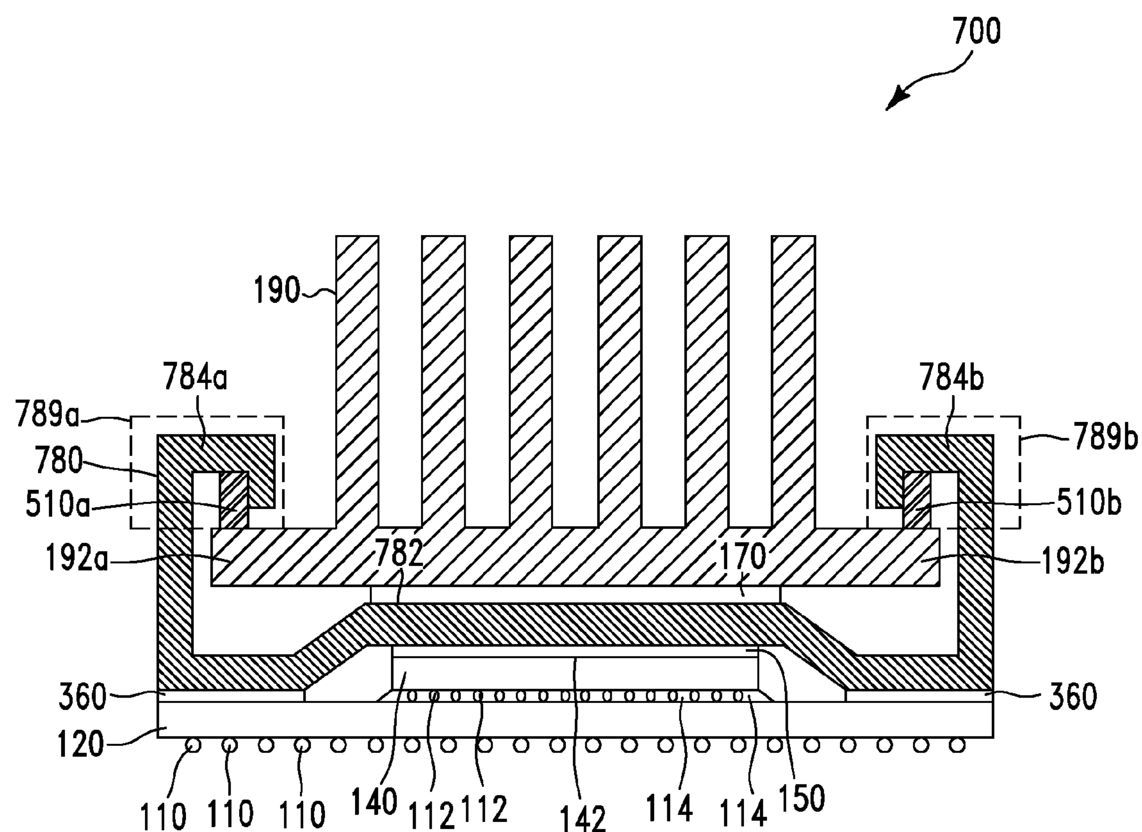
FIG. 7 shows a cross-section view of a structure, in accordance with embodiments of the present invention.

FIG. 7 shows a cross-section view of a structure 700, in accordance with embodiments of the present invention. More specifically, in one embodiment, the structure 700 is similar to the structure 300 of FIG. 3A except that the structure 700 comprises the springs 510*a* and 510*b* and that a lid 780 of the structure 700 is different from the lid 380 of FIG. 3A. Illustratively, the lid 780 is similar to the lid 380 (FIG. 3A) except that the lid 780 does not have holders (like the holders 185*a* and 185*b* of FIG. 3A). Instead, overhangs 784*a* and 784*b* keep the springs 510*a* and 510*b* pressing the horizontal members 192*a* and 192*b* down, respectively, resulting in the heatsink 190 being pressed down against the top surface 782 of the lid 780 via the thermal grease layer 170.

In summary, with reference to FIGS. 5A, 6, and 7, the springs 510*a* and 510*b* help hold the heatsink 190 in place by pressing the heatsink 190 down against the top surface 582 of the lid 580 (FIG. 5A), or the bottom surface 142 of the chip 140 (FIG. 6), or the top surface 782 of the lid 780 (FIG. 7).

With reference to FIGS. 1A and 5A, in one embodiment, the lids 180 and 580 comprise protruding members. More specifically, the lid 180 comprises protruding members 189*a* and 189*b* and the lid 580 comprises protruding members 589*a* and 589*b*. In one embodiment, the protruding members 189*a* and 189*b* comprise overhangs 187*a* and 187*b*, respectively, and the protruding members 589*a* and 589*b* comprise the overhangs 584*a* and 584*b*, respectively. Illustratively, the overhangs 187*a* and 187*b* comprise the holders 185*a* and 185*b*, respectively. It should be noted that the protruding members 189*a* and 189*b* apply forces using the holders 185*a* and 185*b* to the heatsink 190 resulting in the heatsink 190 being pressed towards the substrate 120. It should also be noted that the protruding members 589*a* and 589*b* apply forces via the springs 510*a* and 510*b* to the heatsink 190 resulting in the heatsink 190 being pressed towards the substrate 120.

While particular embodiments of the present invention have been described herein for purposes of illustration, many modifications and changes will become apparent to those skilled in the art. Accordingly, the appended claims are intended to encompass all such modifications and changes as fall within the true spirit and scope of this invention.

What is claimed is:

1. A structure, comprising:

a substrate;

a semiconductor chip on top of and physically attached to the substrate;

a lid on top of the substrate, wherein the lid comprises a first thermally conductive material; and a heatsink on top of the lid, wherein the heatsink comprises a second thermally conductive material, wherein the semiconductor chip and the substrate share a common interface surface that defines a reference direction perpendicular to the common interface surface and pointing from the substrate towards the semiconductor chip, wherein the lid is disposed between the substrate and the heatsink, wherein the lid comprises a first protruding member, and wherein the first protruding member of the lid is farther away from the substrate than a portion of the heatsink in the reference direction.

2. The structure of claim 1, wherein the lid further comprises a second protruding member, and wherein the second protruding member is farther away from the substrate than a portion of the heatsink in the reference direction.

3. The structure of claim 1, wherein the first protruding member comprises a first overhang that overlaps the heatsink in the reference direction.

4. The structure of claim 3, wherein the first overhang comprises a first holder.

5. The structure of claim 4, wherein the first holder is in direct physical contact with the heatsink.

6. The structure of claim 1, wherein the lid further comprises an opening, and wherein the semiconductor chip fits in the opening.

7. The structure of claim 1, wherein the lid is not disposed between the semiconductor chip and the heatsink.

8. The structure of claim 1, wherein the lid is physically attached to the substrate via a stiffener.

9. The structure of claim 1, wherein the lid is physically attached to the substrate via an adhesive layer.

10. The structure of claim 1, wherein a bottom member of the lid is oriented upward in the reference direction to create space for the semiconductor chip, and wherein the semiconductor chip is sandwiched between the substrate and the bottom member of the lid.

11. A structure formation method, comprising:

providing a structure which includes a substrate, a semiconductor chip on top of and physically attached to the substrate, and a lid on top of the substrate, wherein the semiconductor chip and the substrate share a common interface surface that defines a reference direction perpendicular to the common interface surface and pointing from the substrate towards the semiconductor chip, and wherein the lid comprises a first thermally conductive material; and placing a heatsink on top of the lid, wherein the heatsink comprises a second thermally conductive material, wherein the lid is disposed between the substrate and the heatsink, wherein the lid comprises a first protruding member, and wherein the first protruding member of the lid is farther away from the substrate than a portion of the heatsink in the reference direction.

12. The method of claim 11, wherein the lid further comprises a second protruding member, and wherein the second protruding member is farther away from the substrate than a portion of the heatsink in the reference direction.

13. The method of claim 11, wherein the first protruding member comprises a first overhang that overlaps the heatsink in the reference direction.

14. The method of claim 13, wherein the first overhang comprises a first holder.

15. The method of claim 14, wherein the first holder is in direct physical contact with the heatsink.

16. The method of claim 11, wherein the lid further comprises an opening, and wherein the semiconductor chip fits in the opening.

17. The method of claim 11, wherein the lid is not disposed between the semiconductor chip and the heatsink.

18. The method of claim 11, wherein the lid is physically attached to the substrate via a stiffener.

19. The method of claim 11, wherein the lid is physically attached to the substrate via an adhesive layer.

20. The method of claim 11, wherein a bottom member of the lid is oriented upward in the reference direction to create space for the semiconductor chip, and wherein the semiconductor chip is sandwiched between the substrate and the bottom member of the lid.

* * * * *